United States Patent [19]

Yuan

[11] 4,264,669

[45] Apr. 28, 1981

[54] BONDABLE ADHESIVE-COATED POLY(PARABANIC ACID) FILM AND LAMINATES

[75] Inventor: Edward L. Yuan, Philadelphia, Pa.

[73] Assignee: E. I. Du Pont de Nemours and Company, Wilmington, Del.

[21] Appl. No.: 79,172

[22] Filed: Sep. 26, 1979

[51] Int. Cl.³ .................... H05K 1/00; H05K 1/18; B32B 3/00; B32B 27/34
[52] U.S. Cl. .................................. 428/209; 174/68.5; 428/262; 428/264; 428/265; 428/290; 428/442; 428/463; 428/261; 428/473.5; 428/476.9; 428/522; 428/901; 428/355; 428/460; 428/441; 428/477.4; 428/524
[58] Field of Search ............... 428/473.5, 355, 476.9, 428/209, 901, 442, 463, 522, 261, 262, 265, 264, 290, 460, 477.4, 441, 524; 174/68.5; 29/625

[56] References Cited

U.S. PATENT DOCUMENTS

| | | | |
|---|---|---|---|
| 3,032,521 | 5/1962 | Sanderson | 428/463 |
| 3,591,562 | 7/1971 | Patton | 528/44 |
| 3,632,412 | 1/1972 | Blance | 428/355 |
| 3,661,859 | 5/1972 | Patton | 528/48 |
| 3,728,150 | 4/1973 | Yuan | 428/355 |
| 3,900,662 | 8/1975 | Yuan | 428/355 |
| 4,148,969 | 4/1979 | Henderson | 428/458 |
| 4,161,564 | 7/1979 | Legbandt | 428/383 |

OTHER PUBLICATIONS

"Poly(Parabanic Acids)–PPA", Exxon, Baytown, Texas, Feb., 1973, pp. 1–20.

Primary Examiner—Ellis P. Robinson

[57] ABSTRACT

Described are poly(parabanic acid) films coated with an acrylic adhesive from aqueous dispersion and laminated articles made therefrom.

6 Claims, No Drawings

BONDABLE ADHESIVE-COATED POLY(PARABANIC ACID) FILM AND LAMINATES

BACKGROUND OF THE INVENTION

1. Field of the Invention

This invention relates to poly(parabanic acid) film coated with an acrylic adhesive and to laminates useful as circuit boards made therefrom.

2. Prior Art

Poly(parabanic acids) and films thereof suitable for use in this invention are shown by Patton U.S. Pat. Nos. 3,591,562 and 3,661,859 and in Exxon Chemical Co. trade literature (e.g., "PPA Poly(Parabanic Acids)", 20 pp., February, 1973). The two Patton patents and the specified trade literature are incorporated herein by reference.

The use of acrylic adhesives with polyimide film is shown in my U.S. Pat. No. 3,900,662, also incorporated herein by reference.

Poly(parabanic acid) polymer films are available commercially from Exxon Chemical Co. under the trade name Tredlon ®.

SUMMARY OF THE INVENTION

According to the present invention, there is provided:

An acrylic adhesive-coated film of a poly(1,3-imidazolidine-2,4,5-trione) [sometimes called poly(parabanic acid) and here, PPBA] having the recurring unit

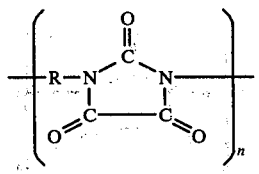

where

R is aromatic, aliphatic, alicyclic aromatic, mixtures thereof and functionally substituted derivatives thereof, and n is sufficiently large to produce a solid product;

the acrylic adhesive being a terpolymer having 15–65% by weight of the terpolymer of acrylonitrile, methacrylonitrile, or mixtures thereof, 30–84% by weight of the terpolymer of butyl acrylate, ethyl acrylate, 2-ethylhexyl acrylate, lauryl acrylate, or mixtures thereof, and 1–15% by weight of the terpolymer of methacrylic acid, acrylic acid, itaconic acid, or mixtures thereof, the acrylic adhesive also containing a cross-linking resin selected from the group consisting of phenol formaldehyde, melamine formaldehyde and hexamethoxymethyl melamine, said resin being present in an amount of about 1–10% by weight of the terpolymer.

There is also provided by this invention laminates made from the foregoing acrylic adhesive-coated PPBA film. Such laminates are made by adhering the acrylic adhesive-coated film to suitable substrates, such as metal foils, e.g., of copper, and the like. Printed circuits, etc., can then be made the laminates.

DESCRIPTION OF THE INVENTION

Patton U.S. Pat. No. 3,661,859 discloses the preparation of polymers of the above formula where R is an organic moiety selected from aliphatic, alicyclic, aromatic, mixtures thereof and functionally substituted derivatives thereof. These polymers are solid and can be used in the present invention. The polymers with higher melting points, e.g., formed from 4,4'-diphenylmethane diisocyanate or 4,4'-diphenylether diisocyanate, etc., are generally preferred but, where lower melting temperatures are acceptable, any of the polymeric or copolymeric films of Patton can be used. These polymers are readily made into film, as noted by Patton, by casting from solution or by heat and pressure. The thickness of the film is not important so long as it is self-supporting, 0.3 mil to 10 mil, for example, being acceptable with 2 mil or above being generally employed.

By "PPBA film" is meant a layer of PPBA, as previously described, or PPBA that contains reinforcing and/or filler material such as natural or synthetic fibers such as fiberglass, boron, polyester, polyamide, acrylic, etc.; woven or nonwoven fabrics made from natural or synthetic fibers such as any of the foregoing; particles such as silica, silicates, carbon black, carbonates, metals, metal oxides, such as magnesium oxide, calcium oxide, aluminum oxides, etc.; and fire retardant materials, such an antimony oxides and/or brominated or chlorinated phosphates, for example, tris(2,3-dibromopropyl)phosphate.

The acrylic adhesive composition can be applied to the PPBA film by conventional application procedures such as spraying, dipping, brushing, roll coating, and the like.

This acrylic adhesive composition should be a terpolymer of 15–65% by weight of the terpolymer of acrylonitrile, methacrylonitrile or mixtures thereof, 30–84% by weight of the terpolymer butyl acrylate, ethyl acrylate, 2-ethylhexyl acrylate, lauryl acrylate or mixtures thereof, and 1–15% by weight of the terpolymer of methacrylic acid, acrylic acid, itaconic acid or mixtures thereof. Also included should be a cross-linking resin such as melamine formaldehyde, phenol formaldehyde, or melamines such as hexamethoxymethyl melamine and the like. These cross-linkers can be present in an amount of about 1–10% by weight of terpolymer. A preferred adhesive composition uses a copolymer of acrylonitrile/butyl acrylate/methacrylic acid in about a 35/60/5 ratio by weight mixed with 5% phenol formaldehyde by weight based on the weight of the terpolymer.

The acrylic adhesive composition can be made by known addition polymerization techniques, such as those disclosed in Sanderson U.S. Pat. No. 3,032,521, the disclosure of which is hereby incorporated by reference.

Preferably, the acrylic adhesive compositions are contained in a dispersion in water. If desired, such aqueous dispersions can contain thickeners, such as polyacrylate thickeners. A suitable thickener is Acrysol ASE-60 polyacrylate thickener available from Rohm and Haas Company. If desired, however, the acrylic adhesive can be contained in a dispersion or solution in suitable organic liquid or mixtures of organic liquids, for example, aromatic hydrocarbons such as toluene, xylene, etc.; aliphatic hydrocarbons such as hexane, octane, etc.; esters such as ethyl acetate, etc.; ketones such as methyl ethyl ketone and methyl isobutyl ketone; and ethers such as monoethers of ethylene glycol. Examples of suitable organic liquids are disclosed in U.S. Pat. No. 3,032,521.

If desired, the acrylic adhesive can contain reinforcing and/or extender material such as those previously enumerated as being suitable for the PPBA film.

The acrylic adhesive can be applied to the PPBA film in varying thickness depending on the desired end use. Greater thickness can be achieved by a plurality of coats. Ordinarily, the acrylic adhesive will have a thickness of at least 0.1 mil and, at the present time, no need is seen to have a thickness of greater than about 20 mils. A preferred thickness is 0.1–10 mils and an especially preferred thickness is about 0.5–3 mils.

The acrylic adhesive-coated PPBA films can be adhered to suitable substrates to form laminates. Suitable substrates include metal and especially metal foils of copper, copper alloys, aluminum, aluminum alloys, nickel, nickel alloys, silver, silver alloys, gold, gold alloys, iron, iron alloys; woven and nonwoven fabrics made from natural or synthetic fibers such as glass, boron, polyester, polyamide, acrylic, etc.; woven and nonwoven fabric impregnated with resin such as polyimide, polyamide, epoxy, acrylic; paper of natural or synthetic fibers such as Nomex ® nylon paper (Nomex ® is a registered trademark of E. I. du Pont de Nemours and Company), etc.; and film of polymer such as polyimide, polyamide, polyester, acrylic, epoxy, polyurethane, etc. Preferred substrates include metal and especially copper, polyimide film, polyamide paper, woven and nonwoven glass fabric, and polyimide or epoxy impregnated glass fabric.

Standard lamination procedures can be used to make the laminates such as vacuum bag lamination, press lamination, roll lamination, etc. The laminates are useful as circuit boards, structural members and the like. Printed circuits, for example, are readily prepared in a conventional manner by dissolving or etching away unwanted copper.

The following Examples illustrate the invention.

EXAMPLE 1

1. A 2-mil film of the hydrolyzed reaction product of hydrogen cyanide and 4,4'-diphenylmethane diisocyanate (prepared according to Example 4 of Patton U.S. Pat. No. 3,661,859;

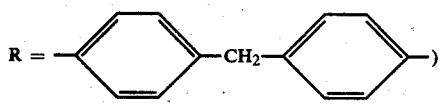

is coated on one side with a 35% by weight dispersion in water of an acrylic adhesive composition. The acrylic adhesive is a mixture of a terpolymer and cross-linking resin. The terpolymer is the reaction product of 35 weight percent acrylonitrile, 60 weight percent butyl acrylate and 5 weight percent methacrylic acid. The cross-linking resin is phenol formaldehyde resin and is present in an amount of 5% by weight, based on the total weight of the terpolymer.

2. A number 30 wire wound rod is drawn down the acrylic adhesive composition to remove excess quantities. The film is then dried at about 240° F. for about 10 minutes. The dried acrylic adhesive has a thickness of about 0.7 mil.

3. The coated side of the PPBA film is then laminated to a foil of 1 ounce copper (that is, 1 ounce per square foot), having "Treatment A" (available from Circuit Foil, Inc.), by applying a temperature of 400° F. and a pressure of about 400 pounds per square inch for 15 minutes.

The resulting laminate is useful to form a circuit board. The copper is found to have excellent adhesion to the PPBA film.

EXAMPLE 2

1. By the procedure of Example 1, the acrylic adhesive of Example 1 is coated on both sides of a film formed from the hydrolyzed polymer of hydrogen cyanide and 4,4'-diphenylether diisocyanate (prepared according to Example 6 of Patton U.S. Pat. No. 3,661,859;

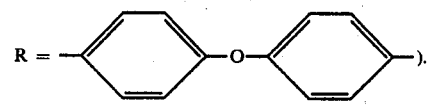

2. One ounce copper foil, having "Treatment A," is then laminated to both sides of the material of (1) in two steps. Step one subjects the laminate to a pressure of 200 pounds per square inch and a temperature of 280° F. for about 10 minutes. Step two subjects the laminate to a pressure of 200 pounds per square inch and a temperature of 400° F. for about 10 minutes.

The resulting laminate has excellent adhesion and is also useful to form a circuit board.

Having described my invention, I claim:

1. A self-supporting poly(parabanic acid) film coated with an acrylic adhesive 0.1–20 mils thick, said poly(parabanic acid) film having the recurring unit

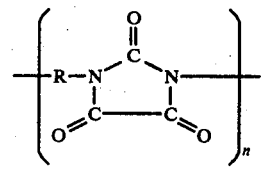

where
R is an organic moiety selected from the group consisting of aliphatic, alicyclic, aromatic, mixtures thereof and functionally substituted derivatives thereof, and
n is sufficiently large to produce a solid product;
said acrylic adhesive being a terpolymer having 15–65% by weight of the terpolymer of acrylonitrile, methacrylonitrile, or mixtures thereof, 30–84% by weight of the terpolymer of butyl acrylate, ethyl acrylate, 2-ethylhexyl acrylate, lauryl acrylate, or mixtures thereof, and 1–15% by weight of the terpolymer of methacrylic acid, acrylic acid, itaconic acid, or mixtures thereof, said acrylic adhesive also containing a cross-linking resin selected from the group consisting of phenol formaldehyde, melamine formaldehyde and hexamethoxymethyl melamine, said resin being present in an amount of about 1–10% by weight of the terpolymer.

2. The coated film of claim 1 wherein R is

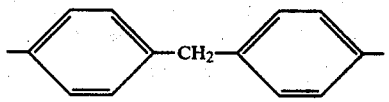

3. The coated film of claim 1 wherein R is

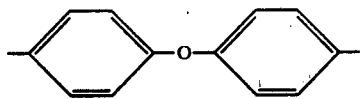

4. Laminate comprising the acrylic adhesive coated film of claim 1 adhered to at least one substrate selected from the group consisting of metal, woven or nonwoven fabric of natural or synthetic fiber, woven or nonwoven fabric of natural or synthetic fiber impregnated with polymer, paper of natural or synthetic fibers and film of polymer.

5. The laminate of claim 4 wherein the substrate is copper.

6. A circuit board formed from the laminate of claim 5.

* * * * *